United States Patent [19]
Levitt

[11] Patent Number: 5,513,186
[45] Date of Patent: Apr. 30, 1996

[54] METHOD AND APPARATUS FOR INTERCONNECT TESTING WITHOUT SPEED DEGRADATION

[75] Inventor: Marc E. Levitt, Sunnyvale, Calif.

[73] Assignee: Sun Microsystems, Inc., Mountain View, Calif.

[21] Appl. No.: 163,989

[22] Filed: Dec. 7, 1993

[51] Int. Cl.$^6$ .................................. H04B 17/00
[52] U.S. Cl. ........................ 371/22.3; 371/22.1
[58] Field of Search ................. 371/22.3, 20.4, 371/21.2, 22.1, 22.4, 22.6, 24; 365/81, 18, 63, 84, 89, 92

[56] References Cited

U.S. PATENT DOCUMENTS

| | | | |
|---|---|---|---|
| 5,202,625 | 4/1993 | Farwell | 371/22.3 |
| 5,220,281 | 6/1993 | Matsuki | 371/22.3 |
| 5,260,948 | 11/1993 | Simpson et al. | 371/22.3 |
| 5,347,520 | 9/1994 | Simpson et al. | 371/22.3 |

Primary Examiner—Emanuel T. Voeltz
Assistant Examiner—Hal D. Wachsman
Attorney, Agent, or Firm—Blakely Sokoloff Taylor & Zafman

[57] ABSTRACT

A method and apparatus is disclosed for advantageously implementing a full boundary scan test of input and bi-directional paths of an integrated circuit. The present invention provides a full boundary scan test capability with practically no degradation of speed of operation during normal operation of the integrated circuit. Within the integrated circuit under test, boundary scan registers are coupled to each input and bi-directional pin. When placed in a test mode, the corresponding output drivers are tristated for every bi-directional pin of the integrated circuit under test. Then the values of a test signal vector asserted on the pins of the integrated circuit are captured by the boundary scan registers. These captured values are retrieved and output from the integrated circuit so that they can be compared to the asserted test signal vector. Because the integrated circuit does not have any non-test specific output pins, there is no need to override values output from the integrated circuit during a full boundary scan test. Furthermore, because the boundary scan registers capture the test signal vector values but cannot override values, the prior art need to provide a multiplexer in the path of each pin in order to make a full boundary scan test is eliminated. Therefore, the present invention permits a full boundary scan test without placing an overhead penalty on each path to and from the pins of the chip.

17 Claims, 7 Drawing Sheets

METHOD AND APPARATUS FOR INTERCONNECT TESTING WITHOUT SPEED DEGRADATION

BACKGROUND OF THE INVENTION

1. Field of the Invention

The present invention relates to integrated circuit testing. More specifically, the present invention implements a method and apparatus for testing the connectivity of an individual integrated circuit unit to a circuit board.

2. Art Background

In an integrated circuit, electronic circuit elements, such as transistors and resistors, are packed together on a single chip of silicon or other material. Typically, an integrated circuit is designed to perform a specific function. Modern integrated circuits can provide a very sophisticated functionality and therefore can be extremely complex. It is not unusual for an integrated circuit to have hundreds of thousands, or even millions, of circuit elements.

Figure 1:
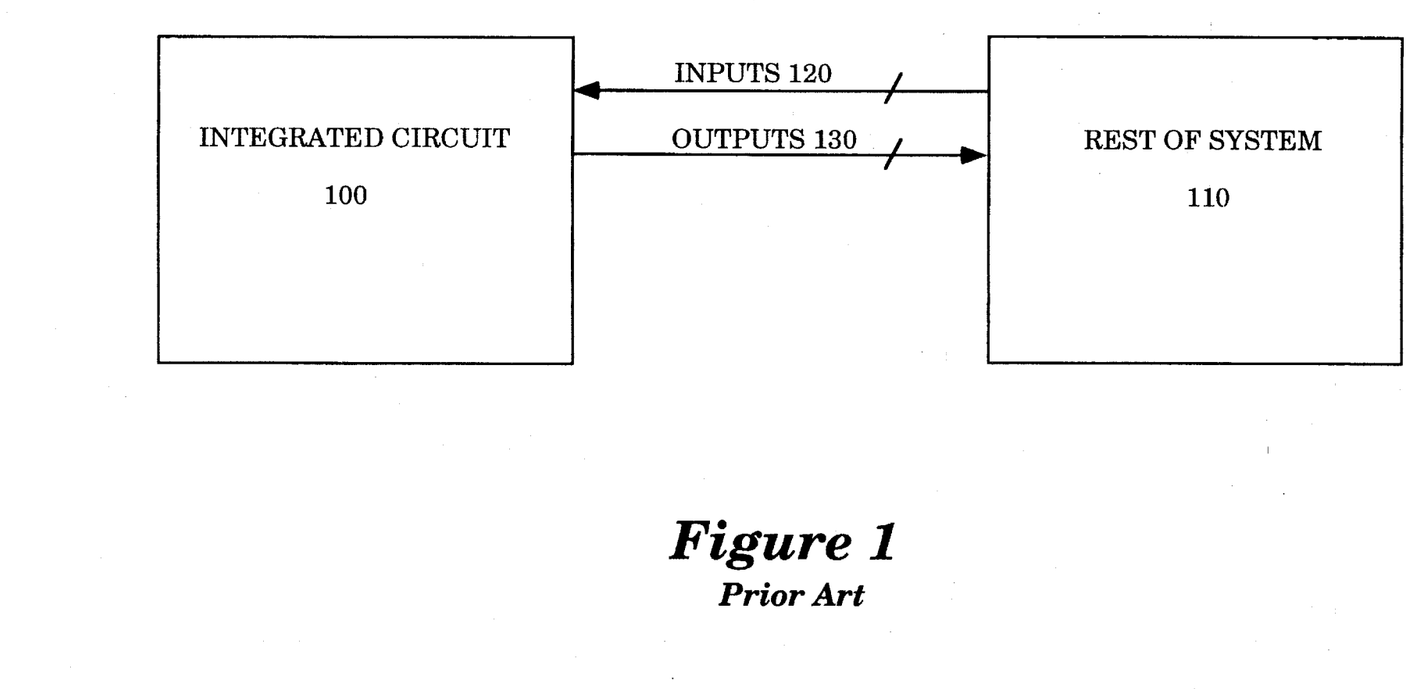
FIG. 1 illustrates a block diagram of a system containing an integrated circuit.

Although an integrated circuit can provide a tremendous amount of functionality, it typically does not operate by itself. Instead, an integrated circuit chip generally functions as a component of a larger system. FIG. 1 depicts a system wherein integrated circuit 100 is coupled to the rest of the system 110. In FIG. 1, input signals 120 are sent to integrated circuit 100 from the rest of the system 110. Similarly, output signals 130 are sent from the integrated circuit 100 to the rest of the system 110. Input 120 and output 130 signals permit integrated circuit 100 to communicate with the rest of the system 110.

Typically, integrated circuit 100 will have pins that are used as conduits to carry input 120 and output 130 signals. Frequently, integrated circuit 100 is coupled to the rest of the system 110 by soldering the pins of integrated circuit 100 into place on a circuit board. When integrated circuit 100 is mounted to a circuit board by soldering, it is possible that one or more of the soldered connections may be defective. Alternately, integrated circuit 100 can be mounted to a circuit board by inserting the pins of integrated circuit 100 into a socket on the circuit board. When inserting integrated circuit 100 into the socket, one or more pins can be bent thereby also causing a defective connection between the circuit board and the integrated circuit 100.

There are basically two types of defective connections. In the first type, an open condition occurs such that there is no electrical connection from a pin of integrated circuit 100 to the board. In the second type of solder defect, a short exists such that two or more pins are connected together electrically. If a connection defect has occurred, integrated circuit 100, and hence the system containing integrated circuit 100, will not function properly. Therefore, it is desirable to have a method to test the connectivity of integrated circuit 100 to the rest of the system 110. Such a test is commonly called a boundary scan test because the pins of integrated circuit 100 form the "boundary" through which integrated circuit 100 interfaces with the rest of the system 110.

One way to perform a traditional boundary scan test on an integrated circuit coupled to a printed circuit board is set forth in a standard established by the Institute of Electrical and Electronics Engineers (IEEE). This standard is referred to as the IEEE standard 1149.1. The IEEE 1149.1 test is well known in the art and is typical of boundary scan tests. A complete description of the IEEE 1149.1 standard and test can be found in the publication: IEEE Standard Test Access Port and Boundary-Scan Architecture, Institute of Electrical and Electronics Engineers, New York, N.Y., 1990. A complete description of the IEEE 1149.1 standard and test can also be found in the publication: The Test Access Port and Boundary-Scan Architecture, by Colin M. Maunder and Rodham E. Tulloss, IEEE Computer Society Press, Los Alimitos, Calif., 1990.

Figure 2:
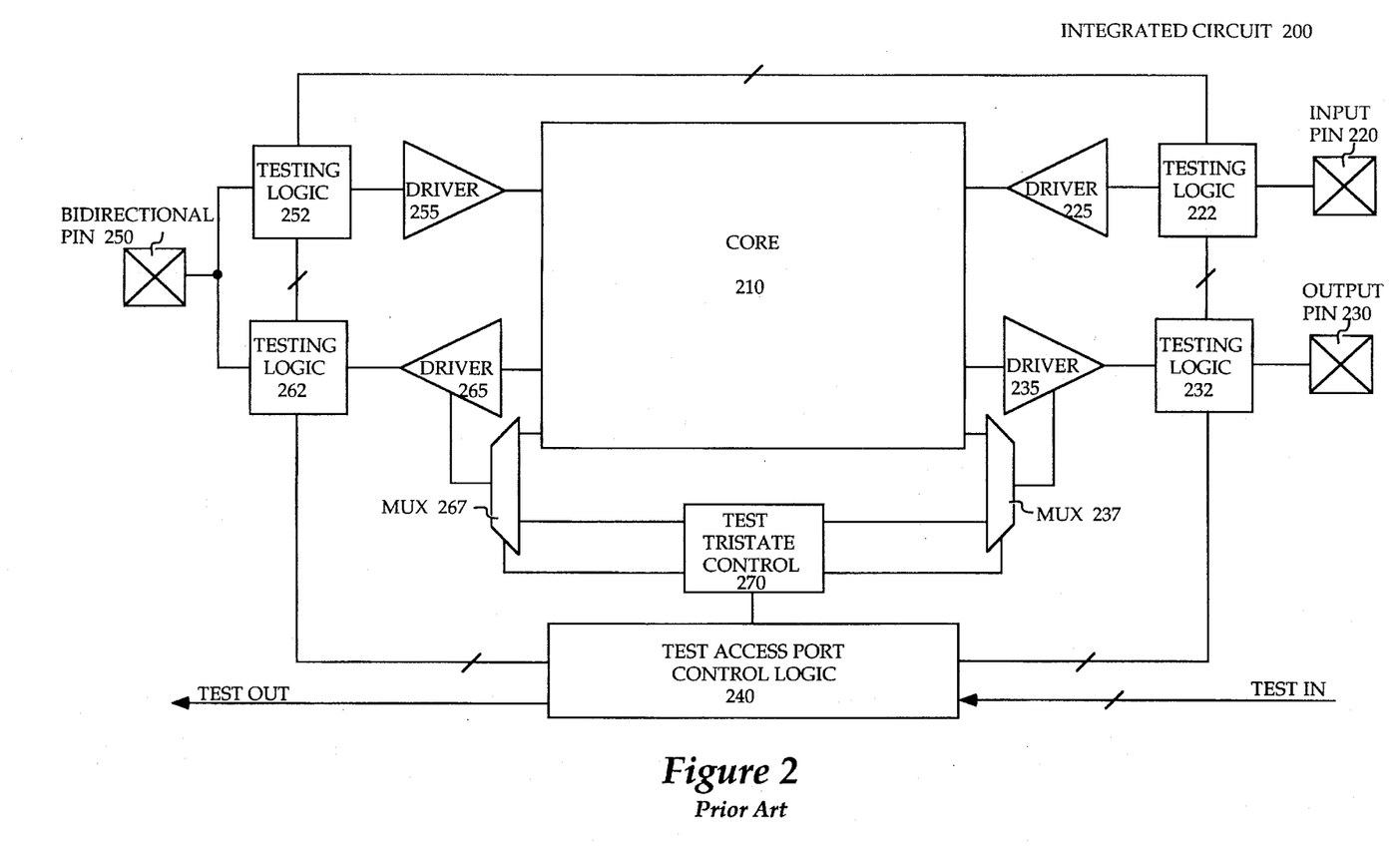
FIG. 2 illustrates an integrated circuit that has a prior art boundary scan test capability.

FIG. 2 illustrates an integrated circuit that has a boundary scan test capability. In FIG. 2, core 210 of integrated circuit 200 is a genetic block of logic that provides the core functionality of the integrated circuit. In actuality, an integrated circuit will have scores or even hundreds of pins. For the purposes of this discussion, however, there are basically only three types of pins: input pins, output pins and bi-directional pins. As their names imply, input pins are used to carry input signals to the integrated circuit and output pins are used to carry output signals from the integrated circuit. Bi-directional pins are a hybrid between input and output pins and therefore can carry signals both to and from the integrated circuit. In FIG. 2, integrated circuit 200 has been simplified so that it only has one non-boundary test related pin per type (i.e. input pin 220, output pin 230 and bi-directional pin 250).

Input pin 220 is used to supply an input signal to core 210. Input driver 225 is placed in the path between input pin 220 and core 210 and amplifies the input signal asserted on input pin 220. Similarly, output pin 230 is used to carry an output signal from core 210. Output driver 235 is placed in the path between output pin 230 and core 210 and amplifies the output signal asserted by integrated circuit 200 on output pin 230.

Bi-directional pin 250 is used to supply an input signal to core 210 and to carry an output signal from core 210. Input driver 255 is placed in the path between bi-directional pin 250 and core 210 and amplifies the input signal asserted on bi-directional pin 250. Similarly, output driver 265 is placed in the path between bi-directional pin 250 and core 210 and amplifies the output signal asserted by integrated circuit 200 on bi-directional pin 250. Output drivers 235 and 265 can both be individually tristated.

Test access port control logic 240 is part of integrated circuit 200 and controls the boundary of integrated circuit 200 during a boundary scan test. Test access port control logic 240, in turn, is controlled externally using input signals TEST IN. The results of the boundary scan test are carried out of integrated circuit 200 from test access port control logic 240 by signal TEST OUT. Typically, input signals TEST IN are supplied to integrated circuit 200 over dedicated input test pins. Typically, signal TEST OUT is output from integrated circuit 200 over a dedicated output test pin.

Multiplexers (MUXs) 237 and 267 are controlled by test tristate control 270. Test tristate control 270. in turn, is controlled by access port control logic 240. When integrated circuit 200 is not being tested, multiplexers 237 and 267 are set so that core 210 controls the enabling and disabling (tristating) of output drivers 235 and 265, respectively. During a boundary scan test, test tristate control 270 can set multiplexers 237 and 267 so that test tristate control 270 can control the enabling and disabling of output drivers 235 and 265.

Testing logic 222 is controlled by test access port control logic 240 and resides on the path between input pin 220 and core 210. Although testing logic 222 is shown in FIG. 2 as being placed between input pin 220 and driver 225, this is an implementation issue. In a variation of the prior art, testing logic 222 is placed between driver 225 and core 210.

When integrated circuit 200 is not being tested, testing logic 222 permits an input signal placed on input pin 220 to pass through to core 210. During a test, test access port control logic 240 can control testing logic 222 and thereby sample the value of the digital signal placed on input pin 220. This captured digital value is then sent by test access port control logic 240 back out of integrated circuit 200 over the dedicated test output pin 230. Test access control logic 240 can also cause test logic 222 to capture a digital value sent by test access port control logic 240. Typically, this digital value is sent to integrated circuit 200 over one of the dedicated test input pins. This captured digital value can then be sent to core 210 from testing logic 222. In this way, test access port control logic 240 can override the input signal placed on input pin 220 during a test.

Testing logic 232 is similar to testing logic 222 and is also controlled by test access port control logic 240. Testing logic 232 resides on the path between output pin 230 and core 210. Although testing logic 232 is shown in FIG. 2 as being placed between output pin 230 and driver 235, this is an implementation issue. In an alternate embodiment, testing logic 232 is placed between driver 235 and core 210.

When integrated circuit 200 is not being tested, testing logic 232 permits an output signal from core 210 to pass through and be placed on output pin 230. During a test, test access port control logic 240 can control testing logic 232 and thereby sample the value of the digital signal output from core 210 and normally destined to be placed on output pin 230. This captured digital value can then be sent by test access port control logic 240 out of integrated circuit 200 over the dedicated test output pin. Test access control logic 240 can also cause test logic 232 to capture a digital value sent by test access port control logic 240. Typically, this digital value is sent to integrated circuit 200 over one of the dedicated test input pins. This captured digital value can then be sent to output pin 230 from testing logic 232. In this way, test access port control logic 240 can override the output signal to be placed on output pin 230 during a test.

Referring now to bi-directional pin 250, bi-directional pin 250 can be seen to be a combination of an input pin and an output pin. Thus, an input signal placed on bi-directional pin 250 passes through testing logic 252, driver 255, and into core 210. On the other hand, an output signal from core 210 passes through driver 265, testing logic 262, and on to bi-directional pin 250. As in the case of input pin 220, when integrated circuit 200 is not being tested, testing logic 252 permits an input signal placed on bi-directional pin 250 to pass through to core 210. During a test, test access port control logic 240 can control testing logic 252 and thereby sample the value of the digital signal placed on bi-directional pin 250. This captured digital value can then be sent by test access port control logic 240 back out of integrated circuit 200 over the dedicated test output pin. Test access control logic 240 can also cause test logic 252 to capture a digital value sent by test access port control logic 240. Typically, this digital value is sent to integrated circuit 200 over one of the dedicated test input pins. This captured digital value can then be sent to core 210 from testing logic 252. In this way, test access port control logic 240 can override the input signal placed on bi-directional pin 250 during a test.

Furthermore, when integrated circuit 200 is not being tested, testing logic 262 permits an output signal from core 210 to pass through and be placed on bi-directional pin 250. During a test, test access port control logic 240 can control testing logic 262 and thereby sample the value of the digital signal output from core 210 and normally destined to be placed on bi-directional pin 250. This captured digital value can then be sent by test access port control logic 240 out of integrated circuit 200 over the dedicated test output pin. Test access control logic 240 can also cause test logic 262 to capture a digital value sent by test access port control logic 240. Typically, this digital value is sent to integrated circuit 200 over one of the dedicated test input pins. This captured digital value can then be sent to bi-directional pin 250 from testing logic 232. In this way, test access port control logic 240 can override the output signal to be placed on bi-directional pin 250 during a test.

Test access port control logic 240, test tristate control 270, testing logic blocks 222, 232, 252, and 262, along with multiplexers 237 and 267, together provide a very powerful testing tool. In a forced test mode, testing logic 222 and 252 can capture the values of respective input signals placed on input pin 220 and bi-directional pin 250. These values can then be retrieved by test access port control logic 240 and output through the signal line TEST OUT to be compared to the values placed on pins 220 and 250. By using well known test patterns (e.g. checkerboard, walking one or walking zero patterns), any open or closed defects in the connection of the input and bi-directional pins to the circuit board can be detected. Furthermore, test access port control logic 240 can use testing logic 232 and 252 to override the values of respective output signals placed on output pin 230 and bi-directional pin 250 using known values sent through the signal lines TEST IN. The signals output from pins 230 and 250 can then be compared to the known override values placed on pins 230 and 250. Once again, by using well known test patterns (e.g. checkerboard, walking one or walking zero patterns), any open or closed defects in the connection of the output and bi-directional pins to the circuit board can be detected.

Figure 3:
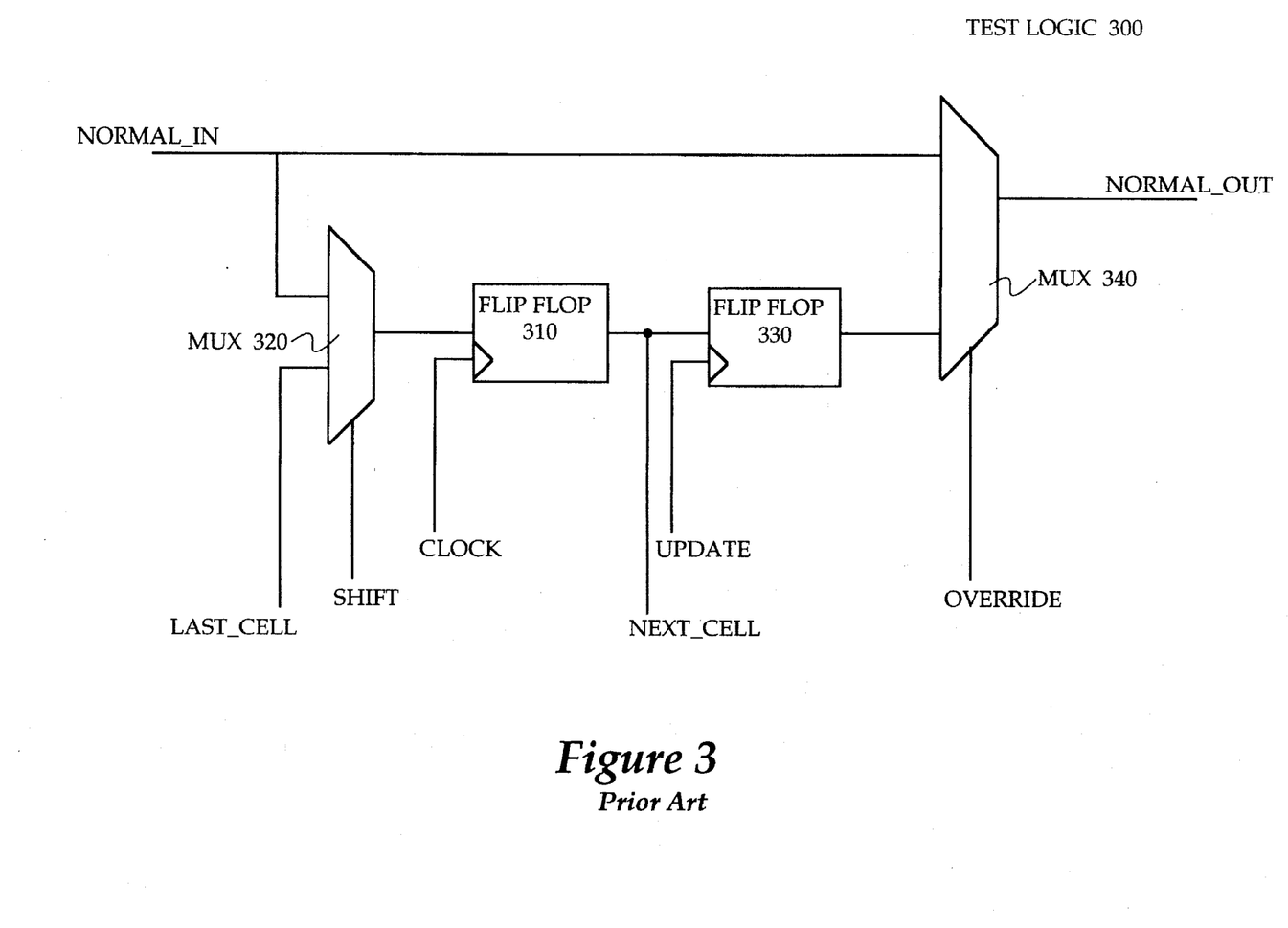
FIG. 3 illustrates test logic used by the prior art boundary scan test.

Referring now to FIG. 3, a block diagram of test logic 300 is illustrated. Test logic 300 is representative of logic that is typically used when implementing a boundary scan test (i.e. testing logic 222, 232, 252 and 262 of FIG. 2). For example, in the case of test logic 222, signal NORMAL_IN is the input signal coming from input pin 220 and signal NORMAL_OUT is the output signal from test logic 222 to driver 225.

Test logic 300 can be used to capture the value of signal NORMAL_IN in flip flop 310 and then provide this captured value as signal NEXT_CELL. Test logic 300 can also be used to capture the value of signal LAST_CELL in flip flop 310 and then force the signal NORMAL_OUT to this value. Finally, test logic 300 can be set so that signal NORMAL_OUT is the same as signal NORMAL_IN.

Each of the test logic cells are linked together serially in a chain so that data can be scanned through the cells. To achieve this, the first cell in the chain receives signal LAST_CELL from the test access port control logic and the last cell in the chain sends signal NEXT_CELL to the test access port control logic. Every other cell in the chain receives signal LAST_CELL from its immediately preceding cell in the chain and sends signal NEXT_CELL to its immediately succeeding cell in the chain.

Control signals SHIFT and CLOCK are provided by the test access port control logic and control the serial scan of data. Whenever data is to be scanned, control signal SHIFT sets multiplexer 320 so that signal LAST_CELL provides the input to flip flop 310. Signal CLOCK then controls flip flop 310 so that on each clock pulse the value stored in flip flop 310 is output from the cell as signal NEXT_CELL and the signal LAST_CELL is captured by flip flop 310.

In FIG. 3, control signal OVERRIDE controls multiplexer 340. During normal operation of the integrated circuit, OVERRIDE sets multiplexer 340 so that signal NORMAL_IN input to multiplexer 340 is passed through multiplexer 340 and output as signal NORMAL_OUT.

Control signal UPDATE is output from the test access port control logic and is a clocking signal that controls flip flop 330. The input to flip flop 330 is the output of flip flop 310. Depending upon how multiplexer 320 was set, the value stored in flip flop 310 is either the signal NORMAL_IN or the signal LAST_CELL. The output of flip flop 330 is provided to multiplexer 340. Thus, multiplexer 340 and flip flop 330 are used to override the value of the signal NORMAL_IN and thereby force the value stored in flip flop 330 to appear as the signal NORMAL_OUT.

By placing testing logic such as that of testing logic 300 in the input path between the core and each input and bi-directional pin, every input value can be sampled and retrieved, or overridden. Furthermore, by placing testing logic such as that of testing logic 300 in the output path between the core and each output and bi-directional pin, every output value can be sampled and retrieved, or overridden. Moreover, each output driver can be tristated. Although this provides a tremendous testing capability, the testing capability comes at a price. This is because mux 340 of each testing logic block provides an overhead, or delay, between core 210 and its respective pins. This overhead is in the path regardless of whether the integrated circuit is being tested or being used in its normal functionality. In a low speed system of the prior art, this delay is not particularly onerous. In a modern high speed system, however, the delay imposed by these testing logic blocks can be significant. For example, a chip that could normally run at 100 megahertz may only be able to operate at 90 megahertz when boundary scan logic is added.

SUMMARY OF THE INVENTION

A method and apparatus is disclosed for advantageously implementing a full boundary scan test of input and bi-directional paths of an integrated circuit. The present invention provides a full boundary scan test capability with practically no degradation of speed of operation during normal operation of the integrated circuit.

Within the integrated circuit under test, boundary scan registers are coupled to each input and bi-directional pin. When placed in a test mode, the corresponding output drivers are tristated for every bi-directional pin of the integrated circuit under test. Then the values of a test signal vector asserted on the pins of the integrated circuit are captured by the boundary scan registers. These captured values are retrieved and output from the integrated circuit so that they can be compared to the asserted test signal vector.

Because the integrated circuit does not have any non-test specific output pins, there is no need to override values output from the integrated circuit during a full boundary scan test. Furthermore, because the boundary scan registers capture the test signal vector values but cannot override values, the prior art need to provide a multiplexer in the path of each pin in order to make a full boundary scan test is eliminated. Therefore, the present invention permits a full boundary scan test without placing an overhead penalty on each path to and from the pins of the chip.

BRIEF DESCRIPTION OF THE DRAWINGS

The objects, features, and advantages of the method and apparatus of the present invention will be apparent from the following detailed description of the invention in which.

DETAILED DESCRIPTION OF THE INVENTION

In the following description, for purposes of explanation, specific numbers, materials and configurations are set forth in order to provide a thorough understanding of the present invention. It will be apparent to one skilled in the art, however, that the present invention can be practiced without these specific details. In other instances, well known systems are shown in diagrammatic or block diagram form in order not to obscure the present invention unnecessarily.

Figure 4:
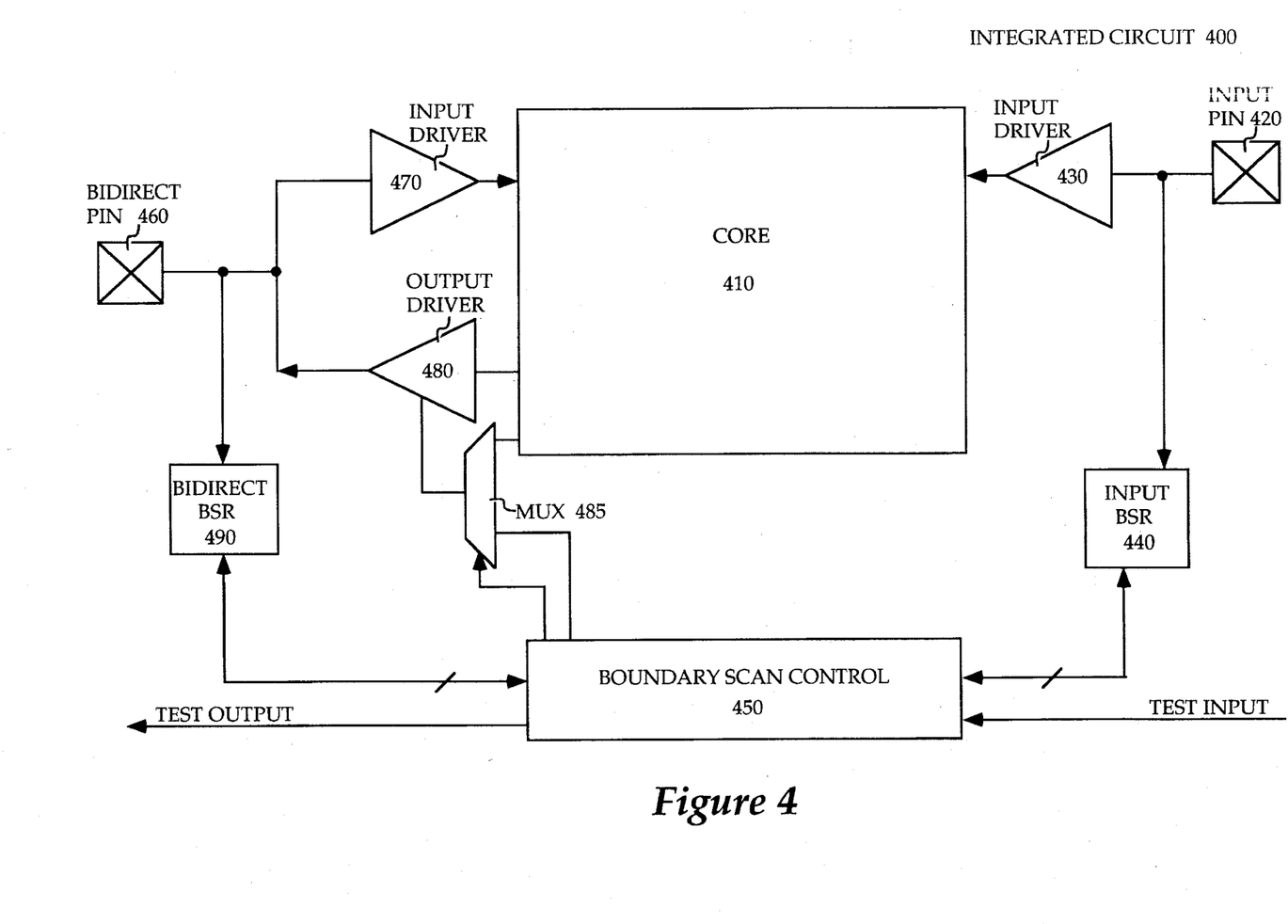
FIG. 4 illustrates an integrated circuit that has circuitry for performing a boundary scan test using an embodiment of the present invention.

FIG. 4 illustrates an integrated circuit that has circuitry for performing a full boundary scan test using an embodiment of the present invention. The present invention exploits the fact that many integrated circuit chips only have input and bi-directional pins. In such a case, because there are no pins that are solely output pins, a full boundary scan test can be performed by asserting known values on the input and bi-directional pins, capturing the values received within the chip and then outputting the captured values from the chip for comparison with the values that were asserted.

A full boundary scan test must test every normal (i.e. non-test exclusive) pin of the integrated circuit. Placing signals on the input or bi-directional pins during a full boundary scan test, however, can cause the integrated circuit being tested to generate spurious signals on the output part of the bi-directional pin circuits. Therefore, in the present invention, the output driver of each bi-directional pin is tristated during a boundary scan test so that any spurious output signals generated by the integrated circuit being tested do not interfere with the boundary scan test results.

A static random access memory (SRAM) integrated circuit chip is an example of an integrated circuit that can be tested using the present invention. A typical SRAM chip performs two functions: it writes data to be stored at an addressable location within the chip and it reads the data stored at addressable locations within the chip. To accomplish these tasks, the SRAM chip typically has input pins for address specification and control. An SRAM chip also typically has bi-directional pins for the input and output of data.

The function performed by a SRAM chip typically depends upon whether a READ/WRITE control signal on its READ/WRITE control input pin is asserted or not. During a WRITE operation, data asserted on the data bi-directional pins of the SRAM chip are stored at an address location within the chip. The address to be written to is specified by asserting the write address on the address input pins. Later, during a READ operation, an address to be read from is specified by asserting the read address on the address input pins. The data stored at the read address location asserted on the address input pins is then output from the SRAM chip on the data bi-directional pins.

Because there are no normal pins that are solely output pins, a boundary scan test can be performed for this SRAM chip by asserting known values on the input and bi-directional pins, capturing the values received within the chip and then outputting the captured values from the chip for comparison with the values that were asserted. A full boundary scan test must test every normal (i.e. non-test exclusive) pin of the SRAM integrated circuit. Placing signals on the READ/WRITE and address input pins during a full boundary scan test, however, can cause the SRAM integrated circuit being tested to generate spurious data signals on the output part of the bi-directional pin circuits. It is possible that these spurious signals can falsely cause the SRAM to pass a boundary scan test when a defective connection exists or to falsely fail a boundary scan test when there is no defect. This happens because, during a full boundary scan test, when a test signal asserted on the READ/WRITE input pin is the signal that normally signals the SRAM chip to perform a read operation, the SRAM chip will read the address specified on the address input pins and attempt to output the data read over the data bi-directional pins. In such a case, the tester would not know what the output value should be since the data stored at the address of the read operation is unknown. Therefore, the output driver of each output pin is tristated during a boundary scan test so that any spurious output signals generated by the core of the integrated circuit being tested do not interfere with the boundary scan test results.

In FIG. 4, core 410 of integrated circuit 400 is a generic block of logic that provides the core functionality of the integrated circuit. In the case of the example SRAM chip, core 410 would be the part of integrated circuit that provides the SRAM functionality. In actuality, an integrated circuit will have scores or even hundreds of pins. FIG. 4, however, has been simplified so that integrated circuit 400 only has two normal (i.e. non test specific) pins: input pin 420 and bi-directional pin 460.

Input pin 420 is used to supply an input signal to core 410. Input driver 430 is placed in the path between input pin 420 and core 410 and amplifies the input signal asserted on input pin 420.

Bi-directional pin 460 is used to supply an input signal to core 410 and to carry an output signal from core 410. Input driver 470 is placed in the path between bi-directional pin 460 and core 410 and amplifies the input signal asserted on bi-directional pin 460. Similarly, output driver 480 is placed in the path between bi-directional pin 460 and core 410 and amplifies the output signal asserted by integrated circuit 400 on bi-directional pin 460. Output driver 480 can be tristated.

Boundary scan control 450 is part of integrated circuit 400 and controls the testing of the boundary of integrated circuit 400 during a boundary scan test. Boundary scan control 450, in turn, is controlled externally to integrated circuit 400 using input signal TEST INPUT. The results of the boundary scan test are carried out of integrated circuit 400 from boundary scan control 450 by signal TEST OUTPUT. Input signal TEST INPUT is supplied to integrated circuit 400 over a dedicated input test pin. Signal TEST OUTPUT is output from integrated circuit 400 over a dedicated output test pin.

Multiplexer 485 is controlled by boundary scan control 450. When integrated circuit 400 is not being tested, multiplexer 485 is set so that core 410 controls the enabling and disabling (tristating) of output driver 480. During a boundary scan test, boundary scan control 450 sets multiplexer 480 so that output driver 485 is disabled.

In a prior art boundary scan, one is able to both enable and disable output drivers such as driver 480 during a test. Because of this requirement, a circuit designer cannot optimize the driver control circuitry used during a test to minimize delay during the test. This is because the steps one would take to provide optimization for an enabled output driver are diametrically opposed to the steps one would take to provide optimization for an disabled output driver and the circuitry must provide for both contingencies. In the present invention, because one knows that multiplexer 485 will always be disabled during a boundary scan test, the circuitry for output driver 480 and multiplexer 485 can be optimized to minimize the delay when multiplexer 485 is disabled during a boundary scan case.

Input boundary scan register 440 is controlled by boundary scan control 450 and is coupled to the path between input pin 420 and core 410. Although input boundary scan register 440 is shown in FIG. 4 as being coupled between input pin 420 and driver 430, this is an implementation issue. In an alternate embodiment, input boundary scan register 440 is coupled between driver 430 and core 410. During a test, boundary scan control 450 controls input boundary scan register 440 and thereby samples the value of the digital signal placed on input pin 420. This captured digital value is then sent by boundary scan control 450 back out of integrated circuit 400 over the dedicated test output pin.

It is important to note that although input boundary scan register 440 is coupled to the path between input pin 420 and core 410, input boundary scan register 440 in not placed on the path between input pin 420 and core 410. Therefore, whether or not integrated circuit 400 is being tested, input boundary scan register 440 permits an input signal placed on input pin 420 to pass through to core 410 unimpeded and therefore to pass through without a performance penalty.

Bi-directional boundary scan register 490 is similar to input boundary scan register 440 and is also controlled by boundary scan control 450. Bi-directional boundary scan register is coupled to the path between bi-directional pin 490 and core 410. Although bi-directional boundary scan register 490 is shown in FIG. 4 as being coupled between bi-directional pin 460 and input driver 470, this is an implementation issue. In an alternate embodiment, bi-directional boundary scan register 490 is placed between input driver 470 and core 410. During a test, boundary scan control 450 controls bi-directional boundary scan register 440 and thereby samples the value of the digital signal placed on bi-directional pin 420. This captured digital value is then sent by boundary scan control 450 back out of integrated circuit 400 over the dedicated test output pin.

As in the case of input boundary scan register 440, it is important to note that, although bi-directional boundary scan register 490 is coupled to the path between bi-directional pin 460 and core 410, bi-directional boundary scan register 490 in not placed on the path between bi-directional pin 460 and core 410. Therefore, whether or not integrated circuit 400 is being tested, bi-directional boundary scan register 490 permits an input signal placed on bi-directional pin 460 to pass through to core 410 unimpeded.

Furthermore, bi-directional boundary scan register 490 permits an output signal to pass unimpeded from core 410 to bi-directional pin 460. During a boundary scan test, however, output driver 480 is tristated so that an output signal from core 410 cannot reach bi-directional pin 460. Furthermore, sometimes even when no boundary scan test is being performed, output driver 480 will be tristated so that an output signal from core 410 cannot reach bi-directional pin 460.

Boundary scan control 450, input boundary scan register 440 and bi-directional boundary scan register 490, along with multiplexer 485, together provide a very powerful testing tool. In a forced test mode, output driver 480 is tristated. Input boundary scan register 440 and bi-directional boundary scan register 490 can then capture the values of respective input signals placed on input pin 420 and bi-directional pin 460. These values are then retrieved by boundary scan control 450 and output through the signal line TEST OUTPUT to be compared to the values placed on pins 420 and 460. By using well known test patterns (e.g. checkerboard, walking one or walking zero patterns), any open or closed defects in the connection of the input and bi-directional pins to the circuit board can be detected.

The TEST INPUT signal and the test vector signals are generated by a tester external to the integrated circuit under test. Similarly the signal TEST OUTPUT from the integrated circuit under test is received and compared to the test vector by the tester. In one embodiment, the tester is a normal component of the system containing the integrated circuit. For example, the tester could be a microprocessor that has the full IEEE 1149.1 capability. This would permit the microprocessor to generate the TEST INPUT and test vector signals necessary for the boundary scan test of integrated circuit 400. Alternately, the tester can be a component that is not normally an element of the system of integrated circuit 400. An example of this type of tester would be a computer that has been programmed to generate the TEST INPUT and test vectors and then to receive and compare the TEST OUTPUT signal. In this embodiment, the tester would typically be coupled to the system to be tested by placing a bed of nails tester interface device on the circuit board containing integrated circuit 400.

Boundary scan control 450 is a finite state machine. In one embodiment, integrated circuit 400 is normally in a non-test mode. A series of pulses are then input to boundary scan control to over signal line TEST INPUT to control the progression of a boundary scan test. In this embodiment, a first pulse on the signal line TEST INPUT causes boundary scan control 450 to enter a test mode and disable all output drivers for the bi-directional pins. A second pulse on signal line TEST INPUT causes boundary scan control 450 to force the input and bi-directional boundary scan registers to capture the value of a test signal that has been placed on their respective input and bi-directional pins. Then a series of pulses, equal in number to the number of input and bi-directional pins of the integrated circuit, is asserted on signal line TEST INPUT. Each pulse of this series causes boundary scan control 450 to make a corresponding predetermined one of the input and bi-directional boundary scan registers send its captured value out of integrated circuit 400 over signal line TEST OUTPUT. After all of the captured values have been output, boundary scan control 450 causes integrated circuit 400 to return to the non-test mode.

In an alternate embodiment, signal lines TEST INPUT and TEST OUTPUT are combined into a single pin. Each control pulse asserted externally onto this single pin is spaced a predetermined period from its preceding pulse. This predetermined period is chosen to be long enough so that when the captured values are being output from the chip boundary scan control 450 can retrieve and assert each captured output value on the single pin before the next external control pulse is asserted.

In yet another embodiment, signal lines TEST INPUT and TEST OUTPUT are not combined and signal line TEST INPUT is bifurcated into two signals. A first TEST INPUT signal is asserted the entire time that a boundary scan is being performed and signals the beginning and end of the boundary scan test. A second TEST INPUT signal provides a clock that controls the state transitions of boundary scan control 450 during the boundary scan test. Note that these signals have corresponding signals in the IEEE 1149.1 standard. Therefore, in this embodiment the entire set of IEEE 1149.1 pins can be implemented.

Figure 5:
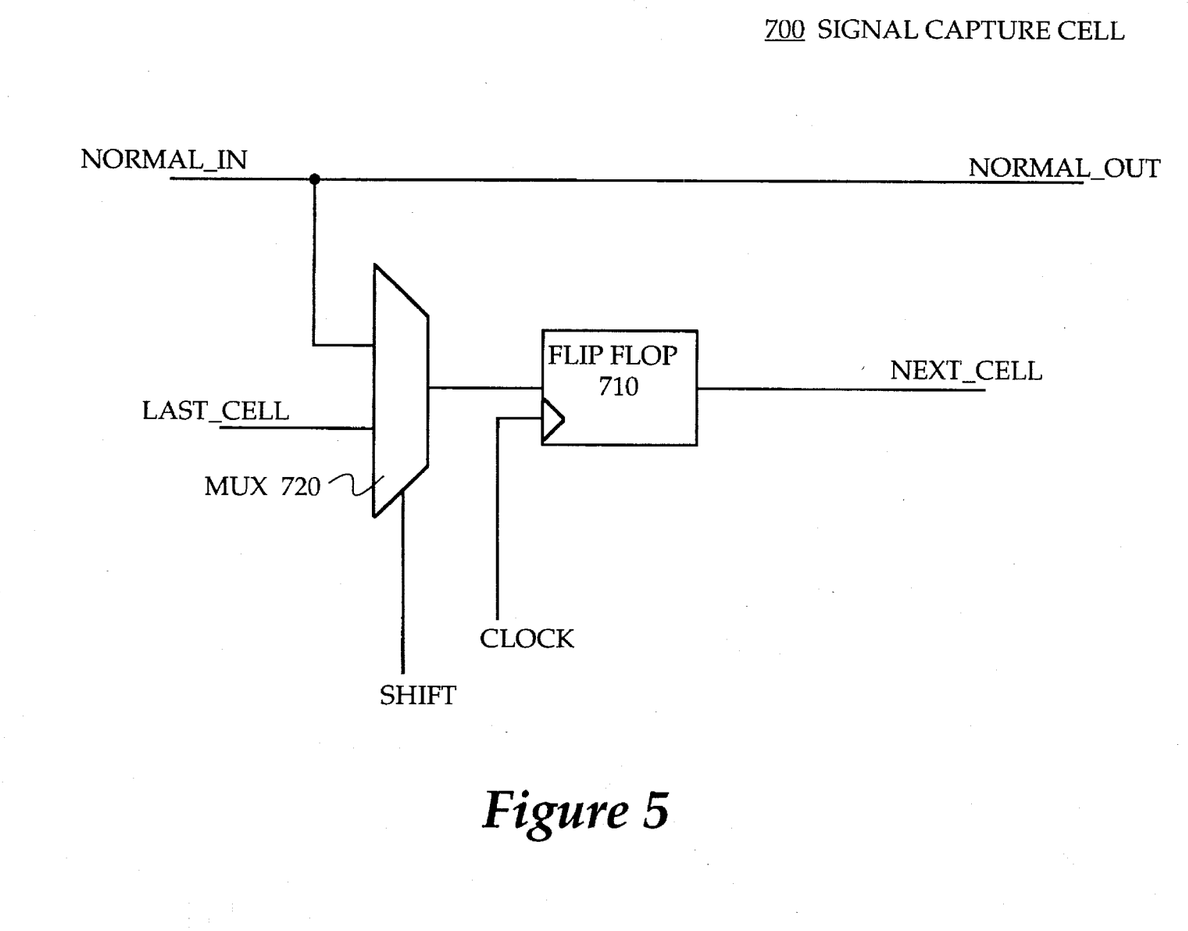
FIG. 5 illustrates an embodiment of a signal capture cell that has no multiplexer overhead in the normal signal path.

FIG. 5 is a signal capture cell that can be used as a boundary scan register (such as bi-directional and input boundary scan registers 490 and 440, respectively, of FIG. 4). Signal capture cell 700 of FIG. 5 can be used to capture a signal without placing any overhead on the normal signal path. The captured signal can then be scanned out of the cell 700.

Control signal SHIFT and clock signal CLOCK are provided from the boundary scan control logic. When the signal NORMAL_IN is to be captured, control signal SHIFT is set so that the signal NORMAL_IN is provided as output from multiplexer 720 and input into flip flop 710. A pulse from clock signal CLOCK then causes flip flop 710 to capture the value of signal NORMAL_IN.

Each of the cells 700 are linked serially with the first cell 700 receiving the signal LAST_CELL from the boundary scan control and the last cell 700 sending the signal NEXT_CELL to the boundary scan control logic. When data is to be scanned out of the cells 700, signal SHIFIT is set so that multiplexer 720 provides the signal LAST_CELL as the input to flip flop 710. Clock signal CLOCK then sends a series of clock pulses, one clock pulse per cell 700, and the contents of the cells 700 are then scanned through boundary scan control logic and out of the integrated circuit chip.

Figure 6:
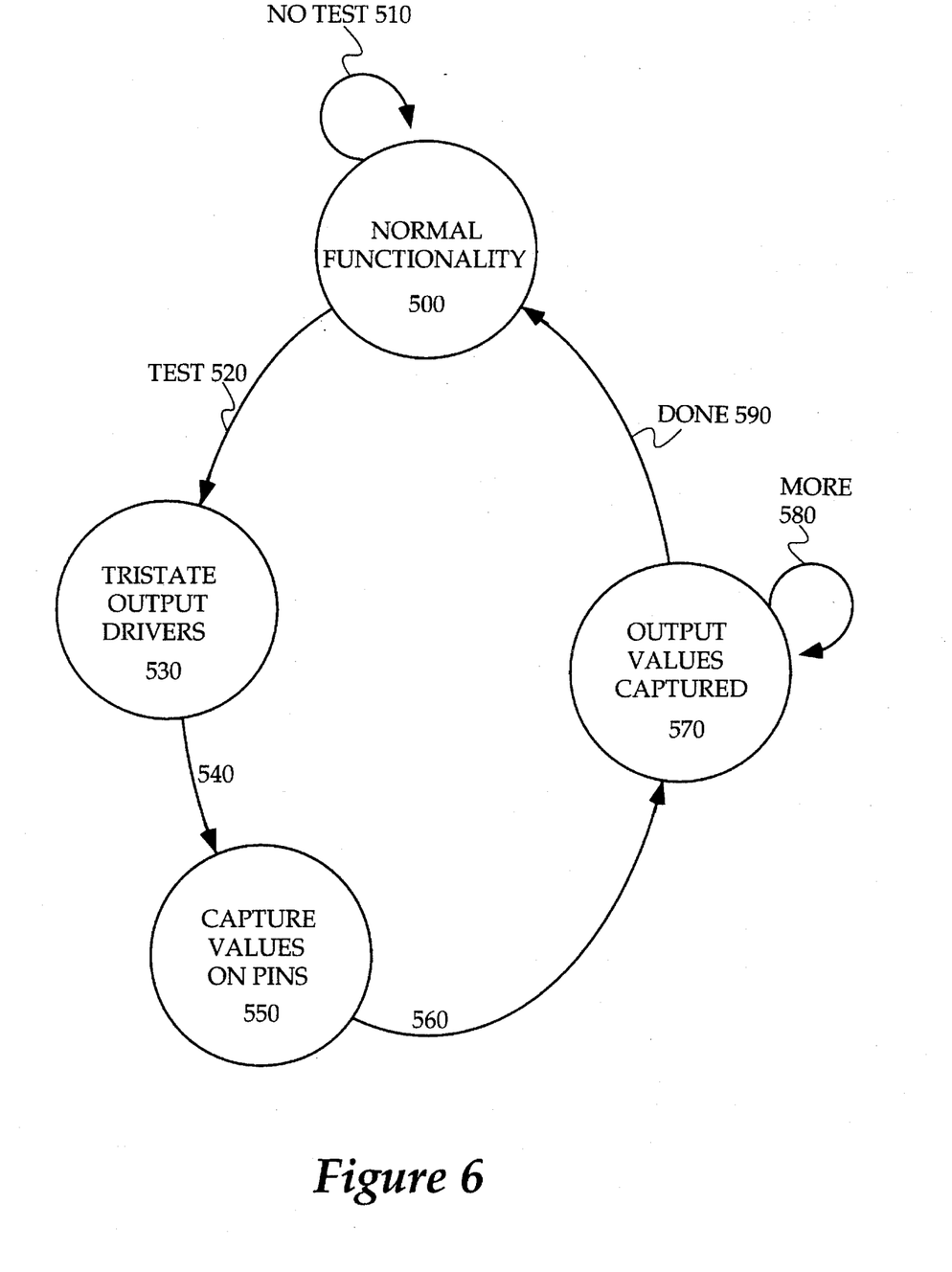
FIG. 6 is a state transition diagram for the boundary scan control logic of an embodiment of the present invention.

FIG. 6 is a state transition diagram for the boundary scan control logic of an embodiment of the present invention. State 500 is the initial state of the boundary scan control logic. In state 500, no boundary scan test is being performed and therefore the boundary scan control logic permits the normal operation of the integrated circuit. So long as no indication is made to the boundary scan control logic that a test is to be performed, stated transition path 510 will continually be taken and the boundary scan control logic will remain in state 500.

When the boundary scan control logic is in state 500 and it receives an order to perform a boundary scan test, transition arrow 520 will be taken from state 500 to state 530. In state 530 the test will begin with the boundary scan control logic forcing all of the output drivers to tristate.

Once every output driver has been tristated, transition arrow 540 will be taken to state 550. In state 550, the boundary scan control logic will order every boundary scan register to capture the value being asserted on its corresponding input or bi-directional pin.

After every boundary scan register has captured the value being asserted on its corresponding input or bi-directional pin, transition arrow 560 will be taken to state 570. In state 570, the boundary scan control logic will retrieve the value captured from a first boundary scan register and output this value over the TEST OUTPUT line from the integrated circuit to the tester.

After the value captured in the first boundary scan register has been retrieved by the boundary scan control logic and output from the integrated circuit to the tester over the TEST OUTPUT line, transition arrow 580 will be taken back to state 570. In state 570, the boundary scan control logic will retrieve the value captured from a second boundary scan register and output this value from the integrated circuit to the tester over the TEST OUTPUT line.

The content of each boundary scan register will be retrieved and output following a predetermined boundary scan register sequence. Therefore, path 580 will continue to be followed until the value captured in each boundary scan register has been retrieved and outputted. After the last boundary scan register has had its contents retrieved and outputted, path 590 will be taken back to state 500.

In state 500 normal functionality will be returned to the integrated circuit. Therefore control of the output drivers will be returned to the core and those output drivers that were enabled before the test will be enabled once more. The boundary scan control logic will continue taking path 510 unless it receives another order to perform another boundary scan test. Therefore, until the boundary scan control logic receives another order to perform a boundary scan test and again takes path 520, the boundary scan control logic will remain in state 500 thereby permitting normal functionality for the integrated circuit.

In an alternate embodiment, rather than transition from state 570 to state 500, the state changes back from 570 to 550 and another test vector is captured. Therefore, the return to normal functionality and ensuing need to retristate the output drivers between test vectors is eliminated.

Figure 7:
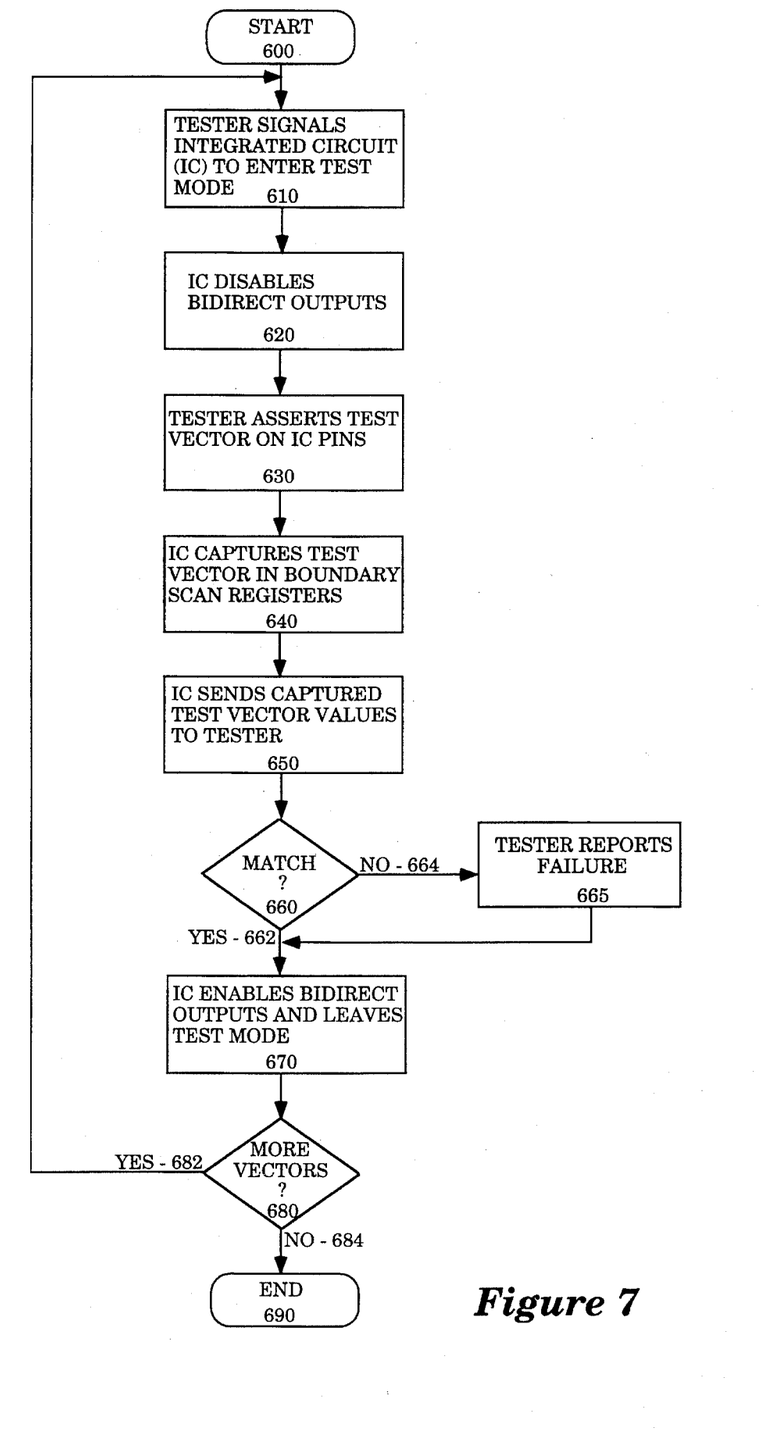
FIG. 7 is a flow chart of a boundary scan test of an embodiment of the present invention.

FIG. 7 is a flow chart of a boundary scan test of an embodiment of the present invention. The test starts at start bubble 500 with the integrated circuit to be tested in a state where it is providing normal (i.e. non-test) functionality.

In process block 610 the tester signals the integrated circuit to be tested that the integrated circuit is to enter a test mode so that a boundary scan test can be performed. In response, the integrated circuit disables the output drivers of its bi-directional pins in preparation to capture signals placed on the pins of the integrated circuit by the tester.

In process block 630 the tester asserts a test vector on the pins of the integrated circuit to be tested. For example, the test vector can be one wherein a signal is asserted on a first pin of the integrated circuit and no signal is asserted on any other pins. When the test vector has been asserted by the tester, the integrated circuit captures the values associated with the test vector in its boundary scan registers (one value per boundary scan register and one boundary scan register per pin).

After the integrated circuit has captured the test vector, it sends the test values captured out a serial test output port in process block 650. In decision block 660, the test vector captured and output by the integrated circuit is compared to the test vector that was asserted by the tester. If the test vector captured does not match the test vector asserted by the tester, then a connectivity defect has been found and decision path 664 is taken to process block 665 where the test failure is reported. For example, in the case where the test vector was one where a signal was asserted on the first pin but no other pin was asserted. If an open defect exists for the first pin, then the captured test vector will indicate that no signal was asserted on any pin. Therefore, the open defect on the first pin will be detected. On the other hand there may be a closed defect wherein the first pin is shorted with the second pin. In that case, the captured vector will indicate that a signal was asserted on both the first an second pins (but no others). Therefore, the closed defect between the first and second pins will have been detected.

If a failure was found, after reporting the failure in process block 665, processing will proceed to processing block 670.

The integrated circuit then leaves the test mode in process block 670 and returns to normal functionality. When returning to normal functionality, control of the output drivers of the bi-directional pins is returned to the integrated circuit core and any output drivers that were enabled prior to entering the test mode are enabled once more.

Referring again to decision block 660, if the test vector captured matches the test vector asserted by the tester, then the integrated circuit passed the test for the current test vector. In such a case, decision path 662 is taken to process block 670 where the integrated circuit leaves the test mode and returns to normal functionality.

Once the test integrated circuit has left the test mode, the tester determines in decision block 680 whether or not there are more test vectors in the boundary scan test. Typically, several different test vectors will be used to ensure that the entire boundary has been checked. For example, after testing using a test vector that has only the first pin asserted, a test vector will be used wherein only the second pin is asserted. In turn, successive tests will be made, until each pin has had a chance to be the only pin having a signal asserted on it.

If it is determined in decision block 680 that there are more test vectors to be tested, then the next test vector is selected and decision path 682 is taken to process block 610 where the next test is begun. On the other hand, if it is determined in decision block 680 that there are no more test vectors to be tested, then decision path 684 is taken to terminal bubble 690 where the test ends.

In an alternate embodiment, the test vector loop can be performed without returning to normal functionality between each test vector. In this case, decision block 680 would be moved to immediately before process block 670. Then, if it is discovered in decision block 680 that there are more test vectors, decision path 682 will be taken to procedure block 630 and the next text vector will be asserted.

While the method and apparatus of the present invention has been described in terms of its presently preferred and alternate embodiments, those skilled in the art will recognize that the present invention may be practiced with modification and alternation within the spirit and scope of the appended claims. The specifications and drawings are, accordingly, to be regarded in an illustrative rather than a restrictive sense.

What is claimed is:

1. An electrical component coupled to a circuit board, the electrical component comprising:

a functional core;

at least one bi-directional pin to carry a first input signal from the circuit board to the functional core and to carry an output signal from the functional core to the circuit board;

at least one bi-directional boundary scan register coupled to the at least one bi-directional pin but not placed on a path between the functional core and the at least one bi-directional pin;

at least one tristatable output driver; and boundary scan control logic, such that when the electrical component is placed in a test mode, the boundary scan control logic causes the at least one tristatable output driver to tristate and block the output signal from the functional core to the circuit board, the boundary scan control logic then causes the at least one bi-directional boundary scan register to capture the first input signal and further causes the captured first input signal to be output from the electrical component.

2. The electrical component as set forth in claim 1, the electrical component further comprising:

at least one input pin to carry a second input signal from the circuit board to the functional core;

at least one input boundary scan register coupled to the at least one input pin but not placed on a path between the functional core and the at least one input pin such that when the electrical component is placed in the test mode, the boundary scan control logic further causes the at least one input boundary scan register to capture the second input signal placed on the at least one input pin and further causes the captured second input signal to be output from the electrical component.

3. A system, comprising:

a circuit board;

an electrical component coupled to the circuit board, the electrical component comprising:

a functional core;

at least one bi-directional pin to carry a first input signal from the circuit board to the functional core and to carry an output signal from the functional core to the circuit board;

at least one bi-directional boundary scan register coupled to the at least one bi-directional pin but not placed on a path between the functional core and the at least one bi-directional pin;

at least one tristatable output driver; and boundary scan control logic, such that when the electrical component is placed in a test mode, the boundary scan control logic causes the at least one tristatable output driver to tristate and block the output signal from the functional core to the circuit board, the boundary scan control logic then causes the at least one bi-directional boundary scan register to capture the first input signal and further causes the captured first input signal to be output from the electrical component.

4. The system as set forth in claim 3, further comprising:

a tester coupled to the circuit board, the tester placing the electrical component in the test mode, generating the first input signal and receiving the captured first input signal.

5. The system as set forth in claim 4 wherein the tester further compares the first input signal generated to the received captured first input signal to detect defective connections between the at least one bi-directional pin and the circuit board.

6. The system as set forth in claim 3, the electrical component further comprising:

at least one input pin to carry a second input signal from the circuit board to the functional core;

at least one input boundary scan register coupled to the at least one input pin but not placed on a path between the functional core and the at least one input pin, such that when the electrical component is placed in the test mode, the boundary scan control logic further causes the at least one input boundary scan register to capture the second input signal placed on the at least one input pin and further causes the captured second input signal to be output from the electrical component.

7. The system as set forth in claim 6, further comprising:

a tester coupled to the circuit board, the tester placing the electrical component in the test mode, generating the first input signal and receiving the captured first input signal.

8. The system as set forth in claim 7 wherein the tester further compares the first input signal generated to the received captured first input signal to detect defective connections between the at least one bi-directional pin and the circuit board.

9. The system as set forth in claim 6, further comprising:

a tester coupled to the circuit board, the tester placing the electrical component in the test mode, generating the second input signal and receiving the captured second input signal.

10. The system as set forth in claim 9 wherein the tester further compares the second input signal generated to the received captured second input signal to detect defective connections between the at least one input pin and the circuit board.

11. The system as set forth in claim 6, further comprising:

a tester coupled to the circuit board, the tester placing the component in the test mode, generating the first and second input signals and receiving the captured first and second input signals.

12. The system as set forth in claim 11 wherein the tester further compares the first input signal generated to the received captured first input signal and compares the second input signal generated to the received captured second input signal to detect defective connections among the at least one bi-directional pin, the at least one input pin and the circuit board.

13. A method for interconnecting an electrical component to a circuit board, comprising the steps of:

a) supplying from at least one bi-directional pin a first input signal which is carried from a circuit board to a functional core and an output signal which is carried from the functional core to the circuit board;

b) coupling at least one bi-directional boundary scan register to the at least one bi-directional pin but not placed on a path between the functional core and the at least one bi-directional pin;

c) causing, when the electrical component is placed in a test mode:

i) at least one tristatable output driver to tristate and block the output signal from the functional core to the circuit board;

ii) the at least one bi-directional boundary scan register to capture the first input signal; and iii) the captured first input signal to be output from the electrical component.

14. The method as set forth in claim 13, further comprising the steps of:

coupling a tester to the circuit board;

placing the electrical component in the test mode using the tester;

generating the first input signal with the tester;

and using the tester to receive the captured first input signal.

15. The method as set forth in claim 14 further comprising the step of:

using the tester to compare the first input signal generated to the received captured first input signal to detect defective connections between the at least one bi-directional pin and the circuit board.

16. The method as set forth in claim 13, further comprising the steps of:

generating the second input signal when the electrical component has been placed in the test mode, the tester generating the second input signal;

causing at least one input boundary scan register to capture the second input signal placed on at least one input pin and further causing the captured second input signal to be output from the electrical component; and using the tester to receive the captured second input signal.

17. The method as set forth in claim 16 further comprising the step of:

using the tester to compare the second input signal generated to the received captured second input signal to detect defective connections between the at least one input pin and the circuit board.

* * * * *

UNITED STATES PATENT AND TRADEMARK OFFICE
CERTIFICATE OF CORRECTION

PATENT NO. : 5,513,186
DATED : April 30, 1996
INVENTOR(S) : Levitt

It is certified that error appears in the above-identified patent and that said Letters Patent is hereby corrected as shown below:

In column 14, claim 16 at lines 65-66, please delete " , the tester generating the second input signal; " and insert -- ; --.

Signed and Sealed this

Twenty-third Day of March, 1999

Attest:

Q. TODD DICKINSON

*Attesting Officer*  *Acting Commissioner of Patents and Trademarks*